(12) United States Patent
Okuyama et al.

(10) Patent No.: US 8,198,007 B2
(45) Date of Patent: Jun. 12, 2012

(54) NEGATIVE-WORKING RESIST COMPOSITION AND PATTERN FORMING METHOD USING THE SAME

(75) Inventors: Kenichi Okuyama, Tokyo-to (JP); Satoru Kanke, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 248 days.

(21) Appl. No.: 12/741,246

(22) PCT Filed: Nov. 5, 2008

(86) PCT No.: PCT/JP2008/070134
§ 371 (c)(1),
(2), (4) Date: May 4, 2010

(87) PCT Pub. No.: WO2009/060869
PCT Pub. Date: May 14, 2009

(65) Prior Publication Data
US 2010/0239980 A1    Sep. 23, 2010

(30) Foreign Application Priority Data

Nov. 5, 2007  (JP) ................................. 2007-287686
Sep. 12, 2008  (JP) ................................. 2008-235189

(51) Int. Cl.
*G03F 7/004*  (2006.01)
*G03F 7/30*  (2006.01)

(52) U.S. Cl. ...................... 430/270.1; 430/170; 430/325
(58) Field of Classification Search .................. 430/170, 430/270.1, 325
See application file for complete search history.

(56) References Cited

U.S. PATENT DOCUMENTS 6,093,517 A * 7/2000 Ito et al. ..................... 430/270.1

FOREIGN PATENT DOCUMENTS

| JP | 10-239843 A | 9/1998 |
| JP | 2004-018421 A | 1/2004 |

OTHER PUBLICATIONS

Ueda et al, Three-Component Negative-Type Photoresist Based on Calix[4]resorcinarene, a Cross-linker, and a Photoacid Generator, 1998, Chem. Mater. vol. 10, pp. 2230-2234.*

* cited by examiner

*Primary Examiner* — John Chu
(74) *Attorney, Agent, or Firm* — Ladas & Parry LLP

(57) ABSTRACT

This disclosure provides a negative-working resist composition comprising a calix resorcinarene derivative (A) of specific structure, an acid generator (B) which directly or indirectly generates an acid when exposed to an active energy ray having a wavelength of 248 nm or less, and a cross-linking agent (C).

6 Claims, No Drawings

NEGATIVE-WORKING RESIST COMPOSITION AND PATTERN FORMING METHOD USING THE SAME

TECHNICAL FIELD

The present invention relates to a negative-working resist composition for forming a chemically amplified resist which is useful for fine patterning, and a pattern forming method using the composition.

BACKGROUND ART

In recent years, in the production of semiconductor elements and liquid crystal display elements, fine patterning has been developed rapidly with advances in lithography techniques. Accordingly, there is a demand for high resolution such as a pattern having a width of 50 nm or less.

In general, as a fine patterning technique, shortening the wavelength of a light from an exposing source is employed, and there have been proposed a lithography technique using an exposure light such as ArF, $F_2$, EUV, X-ray, electron beam and other charged particle beam besides currently available KrF excimer laser light. In lithography techniques using these exposure lights, a more sensitive, chemically amplified photosensitive composition has been used.

For example, a negative-working, chemically amplified photosensitive composition contains an alkali-soluble resin, an acid generator component which generates acid when exposed to light, a cross-linking agent, a basic compound, etc. Such a photosensitive composition is changed from an alkali-soluble composition to an alkali-insoluble composition when the resin is cross-linked to the cross-linking agent by the action of an acid that is generated from the acid generator component by exposure to light. Furthermore, the acid generated by the cross-linking reaction reacts catalytically and repeatedly, thereby realizing pattern exposure with a smaller amount of exposure light.

Processing accuracy is important as well as processing size. For example, it has been pointed out that a large variation in pattern sizes, which is shown by the line edge roughness (LER) value, affects the performance of a semiconductor and results in a serious problem.

In semiconductor lithography, conventionally, a resist material based on a polymer having a mass average molecular weight of about 10,000 or more has been used.

However, such a polymer material has a high molecular weight and broad molecular weight distribution, and thus has limited processing size and accuracy in fine patterning.

Accordingly, a low molecular material having a low molecular weight and small molecular size has been developed. Compared to the polymer material, such a low molecular material is expected to have excellent resolution and be less likely to contribute to an increase in LER. As such a low molecular material, there may be mentioned a calix resorcinarene derivative, and negative- and positive-working resist compositions prepared by using the calix resorcinarene derivative have been studied (see Patent Literatures 1 and 2).

Patent Literature 1 discloses a chemically amplified, negative-working radiation-sensitive composition which contains a calix resorcinarene compound (cyclic polyphenol compound) obtained by polycondensation of a resorcinol with an acetaldehyde in the presence of acid catalyst.

The calix resorcinarene compound is, however, highly crystalline and has low solubility in organic solvents that are used for film formation. Although the composition is a chemically amplified composition that is normally considered to have high sensitivity, the use of the calix resorcinarene compound is problematic in that the sensitivity of the composition is remarkably decreased and no sufficient resolution and LER value are provided to the resulting fine pattern.

Also in Patent Literature 1, a 0.1% tetramethylammonium hydroxide (TMAH) aqueous solution is used as the developer. When such a dilute TMAH aqueous solution is used as the developer, it is neutralized by carbon dioxide in the air. As a result, the sensitivity is varied, and it becomes difficult to stably obtain a product.

Patent Literature 2 discloses a calix resorcinarene derivative in which eight phenolic hydroxyl groups are each substituted with a protective or cross-linkable group. The resist composition containing the calix resorcinarene derivative can be used as a negative-working resist composition; however, it has lower sensitivity than chemically amplified resist composition since its cross-linking reaction is promoted by non-chemically amplified reaction mechanism. Also, since all of the phenolic hydroxyl groups of the calix resorcinarene derivative are each protected by a protective or cross-linkable group, the calix resorcinarene derivative slightly dissolves in alkaline developer, and an organic solvent is thus used as the developer. Because of these reasons, it is not clear whether or not it is possible to achieve desired performance when such a non-chemically amplified resist material is used in place of a chemically amplified resist material for which an alkaline developer is used in developing process.

Patent Literature 1: Japanese Patent Application Laid-Open (JP-A) No. H10-239843
Patent Literature 2: JP-A No. 2004-18421

SUMMARY OF INVENTION

Technical Problem

As a result of diligent researches, the inventors of the present invention found out that the calix resorcinarene compound disclosed in Patent Literature 1 has, although it is a chemically amplified compound, low sensitivity and low resolution. This is supposed to be due to the high solubility of the calix resorcinarene compound in alkaline developer.

The present invention was made in the light of the circumstances as described above, and it is an object of the present invention to provide a chemically amplified negative-working resist composition that has high sensitivity and gives a well-shaped pattern with no decrease in resolution, and a pattern forming method using the negative-working resist composition.

Solution to Problem

As a result of diligent researches, the inventors of the present invention found out that the above problem is solved by incorporating a calix resorcinarene derivative of specific structure in a negative-working resist composition, and they achieved the present invention.

More specifically, the negative-working resist composition of the present invention comprises a calix resorcinarene derivative (A) represented by the following chemical formula (1), an acid generator (B) which directly or indirectly gener ates an acid when exposed to an active energy ray having a wavelength of 248 nm or less, and a cross-linking agent (C):

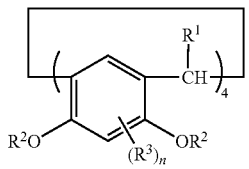

Chemical formula (1)

wherein $R^1$ is an aryl group, an aryl group having a substituent, a cycloalkyl group, a cycloalkyl group having a substituent, or a group represented by the following chemical formula (2):

Chemical formula (2)

wherein Q is an aryl group, an aryl group having a substituent, a cycloalkyl group or a cycloalkyl group having a substituent; and m is an integer of 1 or 2;
wherein each $R^2$ is independently an alkyl group having 1 to 5 carbon atoms, a non-acid-decomposable group which is not decomposed by the action of acid and comprises an alkyl group having 1 to 5 carbon atoms and a substituent selected from the group consisting of a hydroxyl group, a halogen atom and a monovalent group represented by $-OR^a$, or a hydrogen atom; the monovalent group represented by $-OR^a$ is bound to a carbon atom other than the first carbon atom of the alkyl group having 1 to 5 carbon atoms; four to eight of $R^2$s contained in one molecule are non-acid-decomposable groups, and in the case where all $R^2$s are non-acid-decomposable groups, $R^1$ is a group having a hydroxyl group; $R^3$ is an alkyl group having 1 to 5 carbon atoms, an alkyl group having 1 to 5 carbon atoms and a substituent, or a halogen atom; n is an integer of 0 to 2; and groups represented by the same symbol in the formula (1) may be the same or different.

According to the present invention, it is possible to obtain a highly sensitive, well-shaped pattern with no decrease in resolution by incorporating the calix resorcinarene derivative (A) of specific structure in a negative-working resist composition.

From the viewpoint of increasing the film strength of the resulting pattern, it is preferable that the negative-working resist composition of the present invention further comprises a resin (D) which has a repeating unit represented by the following chemical formula (3) and is soluble in alkali developer:

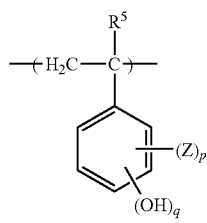

Chemical formula (3)

wherein Z is a halogen atom, a cyano group, a nitro group, an alkyl group, an acyl group, an acyloxy group, an alkylsulfonyl group or an alkoxy group; in the case where plurality of Zs are present, they may be the same or different; $R^5$ is a hydrogen atom, a methyl group, a halogen atom, a cyano group or a trifluoro group; p is an integer of 0 to 4; q is an integer of 1 to 3; and $p+q \leq 5$.

From the viewpoint of obtaining a well-shaped resist pattern and increasing the time-dependent storage stability of the same, it is preferable that the negative-working resist composition of the present invention further comprises an organic basic compound (E).

In the negative-working resist composition of the present invention, from the viewpoint of increasing the sensitivity and resolution, it is preferable that the calix resorcinarene derivative (A) has a development rate of 10 nm/sec or less in a tetramethylammonium hydroxide (TMAH) solution in a concentration of 0.1% by mass.

In the negative-working resist composition of the present invention, from the viewpoint of increasing the sensitivity and resolution, it is preferable that the calix resorcinarene derivative (A) has a development rate of 2,000 nm/sec or less in a tetramethylammonium hydroxide (TMAH) solution in a concentration of 1.19% by mass.

The pattern forming method according to the present invention comprises the steps of:
(i) forming a resist film by applying the negative-working resist composition of the present invention onto a substrate and heating the same, and
(ii) exposing the resist film to electron beam, EUV or X-ray, and heating and then developing the same.

According to the present invention, it is possible to obtain a high-resolution, well-shaped pattern at high sensitivity.

Advantageous Effects of Invention

According to the present invention, it is possible to form a well-shaped pattern with no decrease in resolution at high sensitivity by incorporating the calix resorcinarene derivative (A) of specific structure in a negative-working resist composition.

DESCRIPTION OF EMBODIMENTS

Hereinafter, the negative-working resist composition of the present invention and the pattern forming method using the same will be described in order.
I. Negative-Working Resist Composition The negative-working resist composition of the present invention comprises a calix resorcinarene derivative (A) represented by the following chemical formula (1), an acid generator (B) which directly or indirectly generates an acid when exposed to an active energy ray having a wavelength of 248 nm or less, and a cross-linking agent (C):

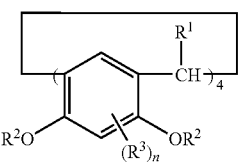

Chemical formula (1)

wherein $R^1$ is an aryl group, an aryl group having a substituent, a cycloalkyl group, a cycloalkyl group having a substituent, or a group represented by the following chemical formula (2):

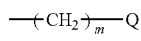

Chemical formula (2)

wherein Q is an aryl group, an aryl group having a substituent, a cycloalkyl group or a cycloalkyl group having a substituent; and m is an integer of 1 or 2;

wherein each $R^2$ is independently an alkyl group having 1 to 5 carbon atoms, a non-acid-decomposable group which is not decomposed by the action of acid and comprises an alkyl group having 1 to 5 carbon atoms and a substituent selected from the group consisting of a hydroxyl group, a halogen atom and a monovalent group represented by —$OR^a$, or a hydrogen atom; the monovalent group represented by —$OR^a$ is bound to a carbon atom other than the first carbon atom of the alkyl group having 1 to 5 carbon atoms; four to eight of $R^2$s contained in one molecule are non-acid-decomposable groups, and in the case where all $R^2$s are non-acid-decomposable groups, $R^1$ is a group having a hydroxyl group; $R^3$ is an alkyl group having 1 to 5 carbon atoms, an alkyl group having 1 to 5 carbon atoms and a substituent, or a halogen atom; n is an integer of 0 to 2; and groups represented by the same symbol in the formula (1) may be the same or different.

Herein, "$R^1$ is a group having a hydroxyl group" refers to the case where $R^1$ is a cycloalkyl group or an aryl group that has a hydroxyl group (OH) as a substituent, or where $R^1$ is a cycloalkyl group or an aryl group represented by the chemical formula (2) wherein Q has a hydroxyl group (OH) as a substituent. The non-acid-decomposable group refers to a group which is not decomposed by the action of acid.

According to the present invention, it is possible to form a well-shaped pattern with no decrease in resolution at high sensitivity by incorporating the calix resorcinarene derivative (A) of specific structure in a negative-working resist composition.

As a result of diligent researches, the inventors of the present invention found out that the calix resorcinarene compound disclosed in Patent Literature 1 has, although it is a chemically amplified compound, low sensitivity and low resolution. This is supposed to be due to the extremely high solubility of the calix resorcinarene compound in alkaline developer. It is considered that because the calix resorcinarene compound has many phenolic hydroxyl groups, the solubility of the calix resorcinarene compound in alkali is promoted and it becomes difficult to control the dissolution rate of the compound in alkaline developer and thus to balance the solubility contrast between exposed and unexposed portions; therefore, the resolution and sensitivity are decreased.

From this viewpoint, the inventors of the present invention performed optimization of the structure of the calix resorcinarene derivative (A) used in the present invention. More specifically, it is possible to decrease the solubility of the calix resorcinarene derivative (A) in alkaline developer by protecting part of the phonolic hydroxyl groups of the calix resorcinarene derivative (A) with non-acid-decomposable groups and thereby decreasing the number of the phenolic hydroxyl groups. Also, the solubility of the calix resorcinarene derivative (A) in alkaline developer can be decreased further by introducing a hydrophobic group such as phenyl group to carbon atoms which connect with adjacent resorcinol portions in the calix resorcinarene derivative (A), and thereby making the calix resorcinarene derivative (A) hydrophobic. In this way, by decreasing the solubility of the calix resorcinarene derivative (A) in alkaline developer as low as developable, it becomes easy to balance the solubility contrast between exposed and unexposed portions.

Accordingly, by optimizing the solubility of the calix resorcinarene derivative (A) in alkaline developer, it becomes possible to control the dissolution rate of the composition in alkaline developer and thus to obtain a high-sensitive pattern with no decrease in resolution.

The acid generator (B) produces acid when exposed to light (irradiated with exposure light) at the time of forming a resist pattern, and by the action of the acid, the calix resorcinarene derivative (A) is cross-linked to the cross-linking agent (C); therefore, thereby the negative-working resist composition becomes insoluble in alkali. In resist pattern formation, accordingly, by selectively exposing a resist film comprising the negative-working resist composition, or by exposing and then heating the same, an exposed portion of the film becomes insoluble in alkali while an unexposed portion remains intact and soluble in alkali; therefore, a negative-working resist pattern can be formed by alkali development.

Hereinafter, the components of the negative-working resist composition of the present invention will be described in order and in detail. In the present invention, "active energy ray" refers to far ultraviolet ray such as KrF excimer laser, ArF excimer laser and $F_2$ excimer laser, and electron beam, EUV, X-ray, etc.

<Calix Resorcinarene Derivative (A) Represented by Chemical Formula (1)>

The calix resorcinarene derivative (A) used in the present invention is represented by the following chemical formula (1):

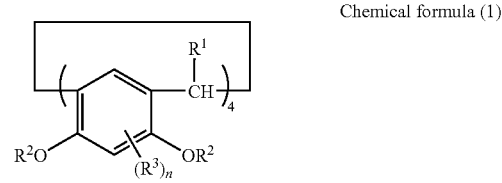

Chemical formula (1)

wherein $R^1$ is an aryl group, an aryl group having a substituent, a cycloalkyl group, a cycloalkyl group having a substituent, or a group represented by the following chemical formula (2):

Chemical formula (2)

wherein Q is an aryl group, an aryl group having a substituent, a cycloalkyl group or a cycloalkyl group having a substituent; and m is an integer of 1 or 2;

wherein each $R^2$ is independently an alkyl group having 1 to 5 carbon atoms, a non-acid-decomposable group which is not decomposed by the action of acid and comprises an alkyl group having 1 to 5 carbon atoms and a substituent selected from the group consisting of a hydroxyl group, a halogen atom and a monovalent group represented by —$OR^a$, or a hydrogen atom; the monovalent group represented by —$OR^a$ is bound to a carbon atom other than the first carbon atom of the alkyl group having 1 to 5 carbon atoms; four to eight of $R^2$s contained in one molecule are non-acid-decomposable groups, and in the case where all $R^2$s are non-acid-decomposable groups, $R^1$ is a group having a hydroxyl group; $R^3$ is an alkyl group having 1 to 5 carbon atoms, an alkyl group having 1 to 5 carbon atoms and a substituent, or a halogen atom; n is an integer of 0 to 2; and groups represented by the same symbol in the formula (1) may be the same or different.

As the aryl group at $R^1$, preferred is the group having 6 to 14 carbon atoms, and more preferred is the group having 6 to 10 carbon atoms. For example, there may be mentioned a phenyl group, a naphthyl group and an anthryl group.

As the cycloalkyl group at $R^1$, preferred is the group having 6 to 25 carbon atoms, and more preferred is the group having 7 to 20 carbon atoms. For example, there may be mentioned a cyclohexyl group, a cycloheptyl group, a cyclooctyl group and an adamantyl group.

As the substituent of the aryl group, for example, there may be mentioned an alkyl group having 1 to 5 carbon atoms, a hydroxyl group, an alkoxy group, an alkoxyalkyl group, a halogen atom and a halogenoalkyl group.

The alkyl group having 1 to 5 carbon atoms may be linear or branched. As the linear alkyl group, for example, there may be mentioned a methyl group, an ethyl group, an n-propyl group and an n-butyl group. As the branched alkyl group, for example, there may be mentioned an i-propyl group, an i-butyl group, a t-butyl group, an i-pentyl group and a t-pentyl group. Among them, a methyl group, an ethyl group, an i-propyl group and a t-butyl group are preferred.

As the alkoxy group, an alkoxy group having 1 to 8 carbon atoms is preferred. For example, there may be mentioned a methoxy group, an ethoxy group, a propoxy group, a butoxy group and a 2-ethylhexyloxy group. Among them, a methoxy group and an ethoxy group are preferred.

As the alkoxyalkyl group, an alkoxyalkyl group having 1 to 8 carbon atoms is preferred. For example, there may be mentioned a methoxymethyl group, an ethoxymethyl group, a methoxyethyl group, an ethoxyethyl group and a methoxypropyl group. Among them, a methoxyethyl group and a methoxypropyl group are preferred, and by introducing any of these groups as a substituent, the adhesion of the composition to a substrate is increased, thereby preventing pattern collapse that occurs upon drying after development.

As the halogen atom, there may be mentioned a fluorine atom, a chlorine atom, a bromine atom and an iodine atom. Preferred are a fluorine atom and a chlorine atom. By introducing any of these groups as a substituent, the adhesion of the composition to a substrate is increased, thereby forming a pattern at high sensitivity.

As the halogenoalkyl group, a halogenoalkyl group having 1 to 8 carbon atoms is preferred. For example, there may be mentioned a chloromethyl group, a dichloromethyl group, a trichloromethyl group, a bromomethyl group, a dibromomethyl group, a tribromomethyl group, a fluoromethyl group, a difluoromethyl group, a trifluoromethyl group, a pentafluoroethyl group, a 1-chloroethyl group, a 1-bromoethyl group, a 1-fluoroethyl group, a 1,2-dichloroethyl group and a 1,1,2,2-tetrachloroethyl group. Among them, a trifluoromethyl group and a pentafluoroethyl group are preferred. By introducing any of these groups as a substituent, the adhesion of the composition to a substrate is increased, thereby forming a pattern at high sensitivity.

As the substituent of the cycloalkyl group at $R^1$, there may be mentioned those which are identical with the above-mentioned examples of the substituent of the aryl group. In the above-mentioned chemical formula (2) as $R^1$, as the substituent of the aryl group and the substituent of the cycloalkyl group, there may be mentioned those which are identical with the above-mentioned examples of the substituent of the aryl group.

Each $R^2$ is independently a group selected from an alkyl group having 1 to 5 carbon atoms, a non-acid-decomposable group which is not decomposed by the action of acid and comprises an alkyl group having 1 to 5 carbon atoms and a specific substituent, and a hydrogen atom. The specific substituent contained in $R^2$ is a hydroxyl group, a halogen atom or a monovalent group represented by —$OR^a$.

The alkyl group having 1 to 5 carbon atoms may be linear or branched. As the linear alkyl group, for example, there may be mentioned a methyl group, an ethyl group, an n-propyl group and an n-butyl group. As the branched alkyl group, for example, there may be mentioned an i-propyl group, an i-butyl group, a t-butyl group, an i-pentyl group and a t-pentyl group. Among them, a methyl group is preferred.

The substituent that the alkyl group having 1 to 5 carbon atoms as $R^2$ has is a hydroxyl group, a halogen atom or a monovalent group represented by —$OR^a$. The monovalent group represented by —$OR^a$ is a group that binds to a carbon atom other than the first carbon atom of the alkyl group having 1 to 5 carbon atoms.

As the halogen atom, there may be mentioned a fluorine atom, a chlorine atom, a bromine atom and an iodine atom. Preferred are a fluorine atom and a chlorine atom.

As $R^a$, an alkyl group having 1 to 5 carbon atoms is preferred. For example, there may be mentioned a methyl group, an ethyl group, an n-propyl group, an n-butyl group and an i-propyl group. Among them, a methyl group and an ethyl group are preferred.

$R^3$ is an alkyl group having 1 to 5 carbon atoms, an alkyl group having 1 to 5 carbon atoms and a substituent, or a halogen atom.

The alkyl group having 1 to 5 carbon atoms may be linear or branched. As the linear alkyl group, for example, there may be mentioned a methyl group, an ethyl group, an n-propyl group and an n-butyl group. As the branched alkyl group, for example, there may be mentioned an i-propyl group, an i-butyl group, a t-butyl group, an i-pentyl group and a t-pentyl group.

As the substituent of the alkyl group having 1 to 5 carbon atoms as $R^3$, there may be mentioned a hydroxyl group, a halogen atom and an alkoxy group, for example.

As the halogen atom, for example, there may be mentioned a fluorine atom, a chlorine atom, a bromine atom and an iodine atom.

As the alkoxy group, an alkoxy group having 1 to 5 carbon atoms is preferred. For example, there may be mentioned a methoxy group, an ethoxy group, an n-propoxy group, an n-butoxy group and an i-propoxy group.

At least one of $R^2$s in each of the repeating units in the chemical formula (1) is a group that is other than a hydrogen atom (non-acid-decomposable group). When both of $R^2$s are each a group other than a hydrogen atom (non-acid-decomposable group), $R^1$ is a group having a hydroxyl group.

In the calix resorcinarene derivative (A), when four to eight of $R^2$s contained in one molecule are non-acid-decomposable groups, groups represented by the same symbol in each repeating unit may be the same or different, and the repeating units may have $R^3$ in the same or different position. For example, in the calix resorcinarene derivative (A), all of the repeating units may be identical as shown in the following chemical formula (4), or they may be different as shown in the following chemical formulae (5) and (6).

Chemical formula (4)

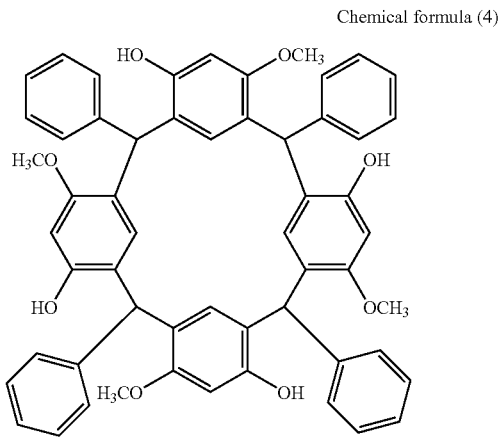

-continued

Chemical formula (5)

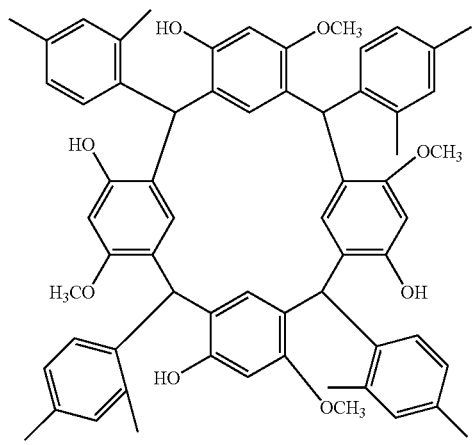

Chemical formula (6)

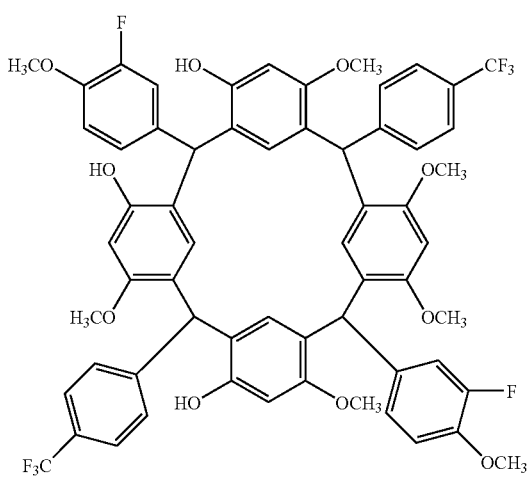

The calix resorcinarene derivative (A) represented by the chemical formula (1) is obtained by, for example, addition-condensation of a phenol and an aldehyde in the presence of acid catalyst.

The content of the calix resorcinarene derivative (A) is preferably 60 to 95% by weight, more preferably 65 to 85% by weight, with respect of the total solid content.

In the present invention, "solid content" refers to the content of components excluding an organic solvent in the negative-working resist composition.

The calix resorcinarene derivative (A) preferably has a development rate of 10 nm/sec or less, more preferably 5 nm/sec or less, in a tetramethylammonium hydroxide (TMAH) solution in a concentration of 0.1% by mass. The sensitivity of the composition can be decreased when the development rate exceeds 10 nm/sec.

The calix resorcinarene derivative (A) preferably has a development rate of 2,000 nm/sec or less, more preferably 1,500 nm/sec or less, particularly preferably 1,000 nm/sec or less, in a tetramethylammonium hydroxide (TMAH) solution in a concentration of 1.19% by mass. If the development rate exceeds 2,000 nm/sec, the sensitivity of the composition can be decreased.

<Acid Generator (B) which Directly or Indirectly Generates an Acid when Exposed to an Active Energy Ray Having a Wavelength of 248 nm or Less>

The acid generator (B) used in the present invention is one which directly or indirectly generates an acid when exposed to an active energy ray having a wavelength of 248 nm or less, and it can be selected from conventionally known acid generators which are used for conventional chemically amplified resist compositions without any particular limitation.

The acid generator (B) is preferably at least one selected from the group consisting of compounds represented by the following chemical formulae (7) to (12).

Chemical formula (7)

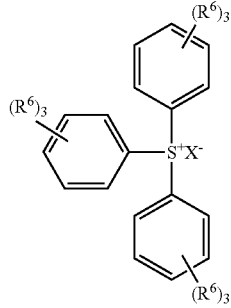

In the chemical formula (7), $R^6$s may be the same or different; each $R^6$ is independently a hydrogen atom, a linear alkyl group having 1 to 12 carbon atoms, a branched alkyl group having 3 to 12 carbon atoms, a cyclic alkyl group having 3 to 12 carbon atoms, a linear alkoxy group having 1 to 12 carbon atoms, a branched alkoxy group having 3 to 12 carbon atoms, a cyclic alkoxy group having 3 to 12 carbon atoms, a hydroxyl group or a halogen atom; and $X^-$ is an alkyl group having 1 to 12 carbon atoms, an aryl group having 6 to 12 carbon atoms, a halogen-substituted alkyl group having 1 to 12 carbon atoms, or a sulfonate ion which has a halogen-substituted aryl group having 6 to 12 carbon atoms, or a halide ion.

As the compound represented by the chemical formula (7), for example, there may be mentioned triphenylsulfonium trifluoromethanesulfonate, triphenylsulfonium nonafluoro-n-butanesulfonate, triphenylsulfonium nonafluorobutanesulfonate, triphenylsulfonium perfluoro-n-octanesulfonate, diphenyl-4-methylphenylsulfonium trifluoromethanesulfonate, diphenyl-2,4,6-trimethylphenylsulfonium trifluoromethanesulfonate, diphenyl-4-t-butoxyphenylsulfonium trifluoromethanesulfonate, diphenyl-4-t-butoxyphenylsulfonium nonafluoro-n-butanesulfonate, diphenyl-4-hydroxyphenylsulfonium trifluoromethanesulfonate, bis(4-fluorophenyl)-4-hydroxyphenylsulfonium trifluoromethanesulfonate, diphenyl-4-hydroxyphenylsulfonium nonafluoro-n-butanesulfonate, bis(4-hydroxyphenyl)-phenylsulfonium trifluoromethanesulfonate, tris(4-methoxyphenyl)sulfonium trifluoromethanesulfonate, tris(4-fluorophenyl)sulfonium trifluoromethanesulfonate, triphenylsulfonium-p-toluenesulfonate, triphenylsulfonium benzenesulfonate, diphenyl-2,4,6-trimethylphenyl-p-toluenesulfonate, diphenyl-2,4,6-trimethylphenylsulfonium-2-trifluoromethylbenzenesulfonate, diphenyl-2,4,6-trimethylphenylsulfonium-4-trifluoromethylbenzenesulfonate, diphenyl-2,4,6-trimethylphenylsulfonium-2,4-difluorobenzenesulfonate, diphenyl-2,4,6-trimethylphenylsulfonium hexafluorobenzenesulfonate, diphenylnaphthylsulfonium trifluoromethanesulfonate, diphenyl-4-hydroxyphenylsulfonium-p-toluenesulfonate, triphenylsulfonium 10-camphorsulfonate and diphenyl-4-hydroxyphenylsulfonium 10-camphorsulfonate.

Chemical formula (8)

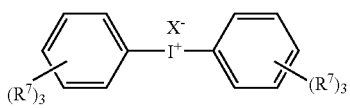

X⁻ and R⁷ of the chemical formula (8) are the same as X⁻ and R⁶ of the chemical formula (7), respectively.

As the compound represented by the chemical formula (8), for example, there may be mentioned bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium p-toluenesulfonate, bis(4-t-butylphenyl)iodonium benzenesulfonate, bis(4-t-butylphenyl)iodonium-2-trifluoromethyl benzenesulfonate, bis(4-t-butylphenyl)iodonium-4-trifluoromethyl benzenesulfonate, bis(4-t-butylphenyl)iodonium-2,4-difluorobenzenesulfonate, bis(4-t-butylphenyl)iodonium hexafluorobenzenesulfonate, bis(4-t-butylphenyl)iodonium 10-camphorsulfonate, diphenyliodonium trifluoromethanesulfonate, diphenyliodonium nonafluoro-n-butanesulfonate, diphenyliodonium perfluoro-n-octanesulfonate, diphenyliodonium p-toluenesulfonate, diphenyliodonium benzenesulfonate, diphenyliodonium 10-camphorsulfonate, diphenyliodonium-2-trifluoromethyl benzenesulfonate, diphenyliodonium-4-trifluoromethyl benzenesulfonate, diphenyliodonium-2,4-difluorobenzenesulfonate, diphenyliodonium hexafluorobenzenesulfonate, bis(4-trifluoromethylphenyl)iodonium trifluoromethanesulfonate, bis(4-trifluoromethylphenyl)iodonium nonafluoro-n-butanesulfonate, bis(4-trifluoromethylphenyl)iodonium perfluoro-n-octanesulfonate, bis(4-trifluoromethylphenyl)iodonium p-toluenesulfonate, bis(4-trifluoromethylphenyl)iodonium benzenesulfonate and bis(4-trifluoromethylphenyl)iodonium 10-camphorsulfonate.

Chemical formula (9)

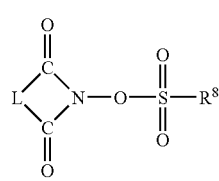

In the chemical formula (9), L is an alkylene group having 1 to 12 carbon atoms, an arylene group having 6 to carbon atoms, or an alkyleneoxy group having 1 to 12 carbon atoms (—R'—O— wherein R' is an alkylene group having 1 to 12 carbon atoms); and R⁸ is an alkyl group having 1 to 12 carbon atoms, an aryl group having 6 to 12 carbon atoms, a halogen-substituted alkyl group having 1 to 12 carbon atoms, or a halogen-substituted aryl group having 6 to 12 carbon atoms.

As the compound represented by the chemical formula (9), for example, there may be mentioned N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hept-5-en-2,3-dicarboximide, N-(trifluoromethylsulfonyloxy)naphthylimide, N-(10-camphorsulfonyloxy)succinimide, N-(10-camphorsulfonyloxy)phthalimide, N-(10-camphorsulfonyloxy)diphenylmaleimide, N-(10-camphorsulfonyloxy)bicyclo[2.2.1]hept-5-en-2,3-dicarboximide, N-(10-camphorsulfonyloxy)naphthylimide, N-(n-octanesulfonyloxy)bicyclo[2.2.1]hept-5-en-2,3-dicarboximide, N-(n-octanesulfonyloxy)naphthylimide, N-(p-toluenesulfonyloxy)bicyclo[2.2.1]hept-5-en-2,3-dicarboximide, N-(p-toluenesulfonyloxy)naphthylimide, N-(2-trifluoromethylbenzenesulfonyloxy)bicyclo[2.2.1]hept-5-en-2,3-dicarboximide, N-(2-trifluoromethylbenzenesulfonyloxy)naphthylimide, N-(4-trifluoromethylbenzenesulfonyloxy)bicyclo[2.2.1]hept-5-en-2,3-dicarboximide, N-(4-trifluoromethylbenzenesulfonyloxy)naphthylimide, N-(perfluorobenzenesulfonyloxy)bicyclo[2.2.1]hept-5-en-2,3-dicarboximide, N-(perfluorobenzenesulfonyloxy)naphthylimide, N-(1-naphthalenesulfonyloxy)bicyclo[2.2.1]hept-5-en-2,3-dicarboximide, N-(1-naphthalenesulfonyloxy)naphthylimide, N-(nonafluoro-n-butanesulfonyloxy)bicyclo[2.2.1]hept-5-en-2,3-dicarboximide, N-(nonafluoro-n-butanesulfonyloxy)naphthylimide, N-(perfluoro-n-octanesulfonyloxy)bicyclo[2.2.1]hept-5-en-2,3-dicarboximide and N-(perfluoro-n-octanesulfonyloxy)naphthylimide.

Chemical formula (10)

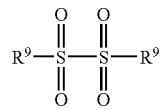

In the chemical formula (10), R⁹s may be the same or different; each R⁹ is independently a linear alkyl group having 1 to 12 carbon atoms, a branched alkyl group having 3 to 12 carbon atoms, a cyclic alkyl group having 3 to 12 carbon atoms, an aryl group having 6 to 12 carbon atoms, a heteroaryl group having 3 to 12 carbon atoms, or an aralkyl group having 7 to 12 carbon atoms; and each of the substituents can be substituted with an alkyl group having 1 to 12 carbon atoms, a hydroxyl group, a halogen atom or a haloalkyl group having 1 to 12 carbon atoms.

As the compound represented by the chemical formula (10), for example, there may be mentioned diphenyl disulfone, di(4-methylphenyl)disulfone, dinaphthyl disulfone, di(4-t-butylphenyl)disulfone, di(4-hydroxyphenyl)disulfone, di(3-hydroxynaphthyl)disulfone, di(4-fluorophenyl)disulfone, di(2-fluorophenyl)disulfone and di(4-trifluoromethylphenyl)disulfone.

Chemical formula (11)

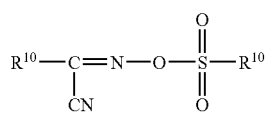

In the chemical formula (11), R¹⁰s may be the same or different; each R¹⁰ is independently a linear alkyl group having 1 to 12 carbon atoms, a branched alkyl group having 3 to 12 carbon atoms, a cyclic alkyl group having 3 to 12 carbon atoms, an aryl group having 6 to 12 carbon atoms, a heteroaryl group having 3 to 12 carbon atoms, or an aralkyl group having 7 to 12 carbon atoms; and each of the substituents can be substituted with an alkyl group having 1 to 12 carbon atoms, a halogen atom or an alkoxy group having 1 to 12 carbon atoms.

As the compound represented by the chemical formula (11), for example, there may be mentioned α-(methylsulfonyloxyimino)-phenylacetonitrile, α-(methylsulfonyloxyimino)-4-methoxyphenylacetonitrile, α-(trifluoromethylsulfonyloxyimino)-phenylacetonitrile, α-(trifluoromethylsulfonyloxyimino)-4-methoxyphenylacetonitrile, α-(ethylsulfonyloxyimino)-4-methoxyphenylacetonitrile, α-(propylsulfonyloxyimino)-4-methylphenylacetonitrile and α-(methylsulfonyloxyimino)-4-bromophenylacetonitrile.

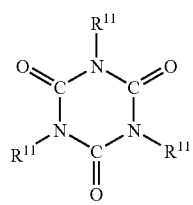

Chemical formula (12)

In the chemical formula (12), $R^{11}$s may be the same or different; each $R^{11}$ is independently a halogenated alkyl group having one or more chlorine atoms or one or more bromine atoms. The carbon number of the halogenated alkyl group is preferably 1 to 5.

As the compound represented by the chemical formula (12), for example, there may be mentioned a monochloroisocyanuric acid, a monobromoisocyanuric acid, a dichloroisocyanuric acid, a dibromoisocyanuric acid, a trichloroisocyanuric acid and a tribromoisocyanuric acid.

Other acid generators suitable as the acid generator (B) include bissulfonyldiazomethanes such as bis(p-toluenesulfonyl)diazomethane, bis(2,4-dimethylphenylsulfonyl)diazomethane, bis(t-butylsulfonyl)diazomethane, bis(n-butylsulfonyl)diazomethane, bis(isobutylsulfonyl)diazomethane, bis(isopropylsulfonyl)diazomethane, bis(n-propylsulfonyl)diazomethane and bis(cyclohexylsulfonyl)diazomethane, and halogen-containing triazine derivatives such as 2-(4-methoxyphenyl)-4,6-(bistrichloromethyl)-1,3,5-triazine, 2-(4-methoxynaphthyl)-4,6-(bistrichloromethyl)-1,3,5-triazine, tris(2,3-dibromopropyl)-1,3,5-triazine and tris (2,3-dibromopropyl)isocyanurate.

As the acid generator (B), these acid generators may be used solely or in combination of two or more kinds. The used amount of the acid generator (B) is 1 to 30 parts by weight, preferably 5 to 20 parts by weight, with respect to 100 parts by weight of the calix resorcinarene derivative (A) of the above-mentioned specific structure. If the used amount is less than the range, no image may be developed. If the used amount is more than the range, no uniform solvent may be obtained, and the composition may have poor storage stability.

<Cross-Linking Agent (C)>

The cross-linking agent (C) of the present invention is not particularly limited and can be appropriately selected from conventionally known cross-linking agents that are used for conventional, chemically amplified negative-working resist composition. For example, there may be mentioned 4,4'-methylenebis[2,6-bis(hydroxymethyl)]phenol (MBHP), 4,4'-methylenebis[2,6-bis(methoxymethyl)]phenol (MBMP), aliphatic cyclic hydrocarbons having a hydroxyl group and/or hydroxyalkyl group, and oxygen-containing derivatives thereof, such as 2,3-dihydroxy-5-hydroxymethylnorbornane, 2-hydroxy-5,6-bis(hydroxymethyl)norbornane, cyclohexanedimethanol, 3,4,8(or 9)-trihydroxytricyclodecane, 2-methyl-2-adamantanol, 1,4-dioxane-2,3-diol and 1,3,5-trihydroxycyclohexane.

Furthermore, there may be mentioned a compound produced by reacting an amino group-containing compound such as melamine, acetoguanamine, benzoguanamine, urea, ethylene urea, propylene urea or glycoluril with formaldehyde or formaldehyde and a lower alcohol, and thus replacing a hydrogen atom of the amino group with a hydroxymethyl group or a lower alkoxymethyl group. Among such compounds produced in this manner, a compound derived from melamine is referred to as a melamine-based cross-linking agent, a compound derived from urea is referred to as a urea-based cross-linking agent, a compound derived from an alkylene urea such as ethylene urea and propylene urea is referred to as an alkylene urea-based cross-linking agent, and a compound derived from glycoluril is referred to as a glycoluril-based cross-linking agent.

As the melamine-based cross-linking agent, for example, there may be mentioned hexamethoxymethylmelamine, hexaethoxymethylmelamine, hexapropoxymethylmelamine and hexabutoxybutylmelamine.

As the urea-based cross-linking agent, for example, there may be mentioned bismethoxymethyl urea, bisethoxymethyl urea, bispropoxymethyl urea and bisbutoxymethyl urea.

As the alkylene urea-based cross-linking agent, for example, there may be mentioned ethylene urea-based cross-linking agents such as mono- and/or dihydroxymethylated ethylene urea, mono- and/or dimethoxymethylated ethylene urea, mono- and/or diethoxymethylated ethylene urea, mono- and/or dipropoxymethylated ethylene urea and mono- and/or dibutoxymethylated ethylene urea; propylene urea-based cross-linking agents such as mono- and/or dihydroxymethylated propylene urea, mono- and/or dimethoxymethylated propylene urea, mono- and/or diethoxymethylated propylene urea, mono- and/or dipropoxymethylated propylene urea and mono- and/or dibutoxymethylated propylene urea; 1,3-di (methoxymethyl)4,5-dihydroxy-2-imidazolidinone; and 1,3-di(methoxymethyl)4,5-dimethoxy-2-imidazolidinone.

As the glycoluril-based cross-linking agent, for example, there may be mentioned mono-, di-, tri- and/or tetrahydroxymethylated glycoluril, mono-, di-, tri- and/or tetramethoxymethylated glycoluril, mono-, di-, tri- and/or tetraethoxymethylated glycoluril and mono-, di-, tri- and/or tetrabutoxymethylated glycoluril.

As the cross-linking agent (C), these cross-linking agents may be used solely or in combination of two or more kinds. The used amount of the cross-linking agent (C) is 3 to 40 parts by weight, preferably 3 to 30 parts by weight, with respect to 100 parts by weight of the calix resorcinarene derivative (A) of the above-mentioned specific structure. If the used amount is less than 3 parts by weight, cross-linking may proceed insufficiently, thereby failing to obtain a well-shaped resist pattern. If the used amount exceeds 40 parts by weight, the resist liquid may have poor storage stability, and the sensitivity of the same can deteriorate over time.

<Resin (D) which has a Repeating Unit Represented by Chemical Formula (3) and is Soluble in Alkali Developer>

The negative-working resist composition of the present invention can further comprise a resin (D) which has a repeating unit represented by the following chemical formula (3) and is soluble in alkali developer (hereinafter, the resin may be referred to as alkali-soluble resin (D)):

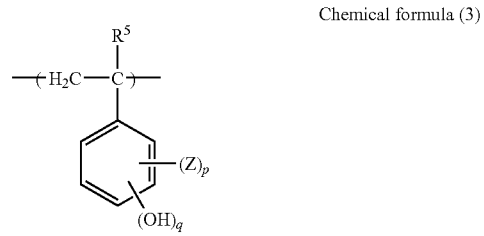

Chemical formula (3)

wherein Z is a halogen atom, a cyano group, a nitro group, an alkyl group, an acyl group, an acyloxy group, an alkylsulfonyl group or an alkoxy group; in the case where plurality of Zs are present, they may be the same or different; $R^5$ is a hydrogen atom, a methyl group, a halogen atom, a cyano group or a trifluoro group; p is an integer of 0 to 4; q is an integer of 1 to 3; and p+q≦5.

As the halogen atom at Z and $R^5$ in the chemical formula (3), there may be mentioned a fluorine atom, a chlorine atom, a bromine atom and an iodine atom.

The alkyl group at Z or the alkyl group of the alkylsulfonyl group at Z is preferably a linear or branched alkyl group having 1 to 5 carbon atoms. For example, there may be mentioned a methyl group, an ethyl group, a propyl group, an n-butyl group, a sec-butyl group and a t-butyl group.

As the alkoxy group at Z, an alkoxy group having 1 to 5 carbon atoms is preferred. For example, there may be mentioned a methoxy group, an ethoxy group, a propoxy group and an n-butoxy group.

As the acyl group at Z, an acyl group having 1 to 8 carbon atoms is preferred. For example, there may be mentioned a formyl group, an acetyl group, a propionyl group, a butyryl group, a valeryl group, a pivaloyl group and a benzoyl group.

As the acyloxy group at Z, an acyloxy group having 2 to 8 carbon atoms is preferred. For example, there may be mentioned an acetoxy group, a propionyloxy group, a butyryloxy group, a valeryloxy group, a pivaloyloxy group, a hexanoyloxy group, an octanoyloxy group and a benzoyloxy group.

Furthermore, Z can be substituted with a halogen atom, etc.

Specific examples of the repeating unit represented by the chemical formula (3) will be shown below. However, the present invention is not limited to these examples.

(X-1)

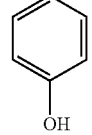

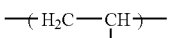

(X-2)

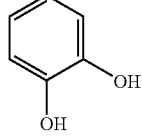

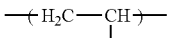

(X-3)

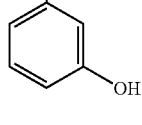

(X-4)

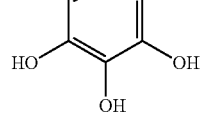

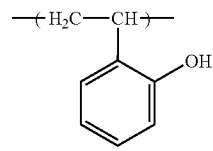

(X-5)

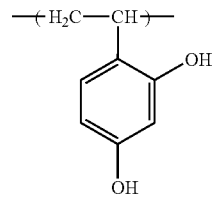

(X-6)

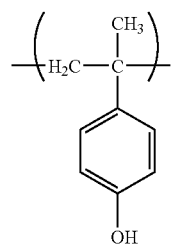

(X-7)

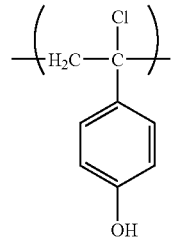

(X-8)

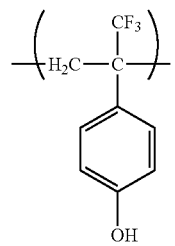

(X-9)

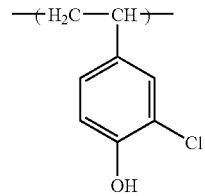

(X-10)

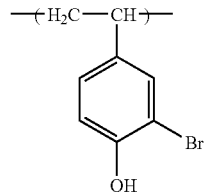

(X-11)

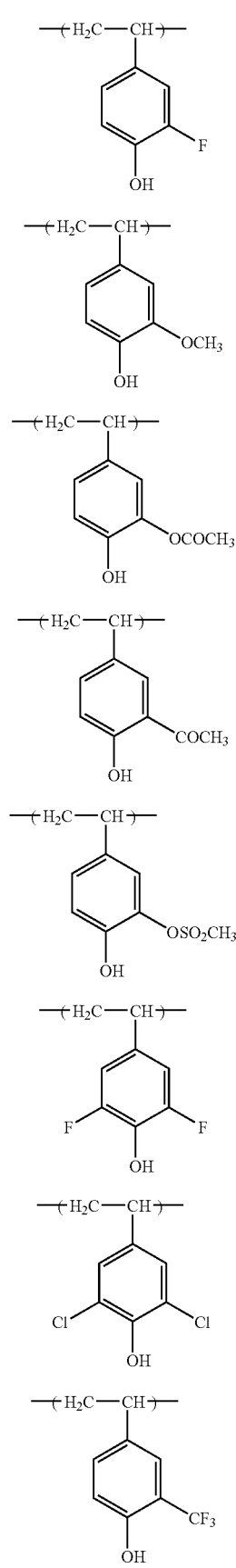
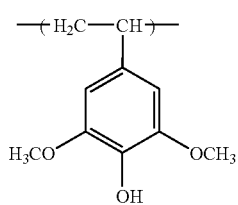

In addition to the above examples, the alkali-soluble resin (D) can contain various kinds of repeating units for the purpose of controlling, for example, dry etching resistance, aptitude for a standard developer, adhesion to the substrate, resist profile and properties that the resist is required to have, such as resolution, heat resistance and sensitivity.

Examples of such various repeating units include, but not limited to, repeating units corresponding to the monomers mentioned below. For example, there may be mentioned a compound that has one addition-polymerizable unsaturated bond selected from the group consisting of acrylic acid and its esters, methacrylic acid and its esters, acrylamides, methacrylamides, allyl compounds, vinyl ethers, vinyl esters, etc.

More specifically, there may be mentioned the following monomers.

As the acrylic acid and its esters, for example, there may be mentioned acrylic acid, methyl acrylate, ethyl acrylate, propyl acrylate, amyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, furfuryl acrylate, tetrahydrofurfuryl acrylate, adamantyl acrylate and norbornyl acrylate.

As the methacrylic acid and its esters, for example, there may be mentioned methacrylic acid, methyl methacrylate, ethyl methacrylate, propyl methacrylate, isopropyl methacrylate, amyl methacrylate, hexyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, tetrahydrofurfuryl methacrylate, adamantyl methacrylate and norbornyl methacrylate.

As the acrylamides, for example, there may be mentioned acrylamide, N-alkylacrylamide, N,N'-dialkylacrylamide, N-hydroxyethyl-N-methylacrylamide and N-2-acetamidoethyl-N-acetylacrylamide.

As the methacrylamides, for example, there may be mentioned methacrylamide, N-alkyl methacrylamide, N,N'-dialkyl methacrylamide and N-hydroxyethyl-N-methylmethacrylamide.

As the allyl compounds, for example, there may be mentioned allyl esters and allyloxyethanol. Specific examples of the allyl esters include allyl acetate, allyl caproate, allyl caprylate, allyl laurate, allyl palmitate, allyl stearate, allyl benzoate, allyl acetoacetate and allyl lactate.

As the vinyl ethers, for example, there may be mentioned alkyl vinyl ether. More specifically, there may be mentioned hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether and tetrahydrofurfuryl vinyl ether.

As the vinyl esters, for example, there may be mentioned vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl-3-phenyl butyrate and vinyl cyclohexyl carboxylate.

In addition, there may be mentioned crotonic acid, itaconic acid, maleic anhydride, maleimide, acrylonitrile, methacrylonitrile, maleilonitrile, etc.

Also, an addition-polymerizable unsaturated compound which is copolymerizable with monomers that correspond to the above-mentioned repeating units, is allowed to be copolymerized. The monomer to be copolymerized is allowed to further contain a substituent.

In the alkali-soluble resin (D), the content of the repeating unit represented by the chemical formula (3) is preferably 40 to 100 mol %, more preferably 70 to 100 mol %.

The weight average molecular weight of the alkali-soluble resin (D) is preferably 2,000 to 80,000, more preferably 2,500 to 8,000.

The content of the alkali-soluble resin (D) is preferably 0.5 to 70% by weight, more preferably 1 to 50% by weight, with respect to the total solid content.

<Organic Basic Compound (E)>

The organic basic compound (E) used in the present invention can be selected from conventionally known organic basic compounds to improve resist pattern shape and temporal stability at the time of storage.

As the organic basic compound (E), there may be mentioned a nitrogen-containing organic compound such as, but not limited to, a nitrogen-containing compound having a nitrogen atom, an amide group-containing compound, an urea compound and a nitrogen-containing heterocyclic compound.

As the nitrogen-containing organic compound, for example, there may be mentioned mono(cyclo)alkylamines such as n-hexylamine, n-heptylamine, n-octylamine, n-nonylamine, n-decylamine, n-dodecylamine and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, methyl-n-dodecylamine, di-n-dodecylmethylamine, cyclohexylmethylamine and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, dimethyl-n-dodecylamine, di-n-dodecylmethylamine, dicyclohexylmethylamine and tricyclohexylamine; alkanolamines such as monoethanolamine, diethanolamine and triethanolamine; aromatic amines such as aniline, N-methylaniline, N,N-dimethylaniline, 2-methylaniline, 3-methylaniline, 4-methylaniline. 4-nitroaniline, diphenylamine, triphenylamine, tribenzylamine and 1-naphthylamine; ethylenediamine, N,N,N',N'-tetramethylethylenediamine, N,N,N',N'-tetrakis(2-hydroxypropyl)ethylenediamine, tetramethylenediamine, hexamethylenediamine, 4,4'-diaminodiphenylmethane, 4,4'-diaminodiphenylether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, polyethyleneimine, polyallylamine and a polymer of N-(2-dimethylaminoethyl)acrylamide.

As the amide group-containing compound, for example, there may be mentioned formamide, N-methylformamide, N,N-dimethylformamide, acetamide, N-methylacetamide, N,N-dimethylacetamide, propionamide, benzamide, pyrrolidone and N-methylpyrrolidone.

As the urea compound, for example, there may be mentioned urea, methylurea, 1,1-dimethylurea, 1,3-dimethylurea, 1,1,3,3-tetramethylurea, 1,3-diphenylurea and tri-n-butylthiourea.

As the nitrogen-containing heterocyclic compound, for example, there may be mentioned imidazoles such as imidazole, benzimidazole, 4-methylimidazole, 4-methyl-2-phenylimidazole, 2-phenylbenzimidazole, 4,5-diphenylimidazole and 2,4,5-triphenylimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinic acid amide, quinoline, 8-oxyquinoline and acridine; and pyrazine, pyrazole, pyridazine, quinozaline, purine, pyrrolidine, piperidine, morpholine, 4-methylmorpholine, piperazine, 1,4-dimethylpiperazine and 1,4-diazabicyclo[2.2.2]octane.

As the organic basic compound (E), these organic basic compounds can be used solely or in combination of two or more kinds. The used amount of the organic basic compound (E) is 0.01 to 10 parts by weight, preferably 0.1 to 5 parts by weight, with respect to 100 parts by weight of the calix resorcinarene derivative (A) of the above-mentioned specific structure. If it is less than 0.01 part by weight, no effect may be obtained by the addition. On the other hand, if it exceeds 10 parts by weight, the sensitivity of the composition tends to decrease, and the developing property of the unexposed portion tends to deteriorate.

<Other Components>

As needed, the negative-working resist composition of the present invention can be further appropriately mixed with a miscible additive such as an additional resin for improving the performance of the resist film, a surfactant for increasing the coatability of the composition, a dissolution inhibitor, a plasticizer, a stabilizer, a colorant and a halation inhibitor.

<Preparation of Negative-Working Resist Composition>

In general, the negative-working resist composition of the present invention is prepared by uniformly mixing an organic solvent (F) with the above-mentioned calix resorcinarene derivative (A) of the above-mentioned specific structure, the acid generator (B), the cross-linking agent (C) and, as needed, other additives.

As the organic solvent (F), organic solvents that are generally used as the solvent for chemically amplified resist can be used. For example, preferred are ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, propylene glycol monomethyl ether propionate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. These solvents can be used solely or in combination as a mixture. The organic solvent (F) can also contain an alcohol such as isopropyl alcohol, ethyl alcohol, methyl alcohol, n-butyl alcohol, s-butyl alcohol, t-butyl alcohol, isobutyl alcohol, 2-methyl-1-pentanol, 4-methyl-2-pentanol, 2-methoxyethanol, 2-ethoxyethanol, 1-ethoxy-2-propanol, 1-methoxy-2-propanol, and/or an aromatic solvent such as toluene and xylene. In the present invention, among the above-mentioned organic solvents, preferably used as the organic solvent (F) are propylene glycol monomethyl ether acetate, which is a safety solvent, and a mixed solvent thereof, as well as diethylene glycol dimethyl ether, cyclohexanone, cyclopentanone, 1-ethoxy-2-propanol and ethyl lactate, which are excellent in dissolving the acid generator contained in the resist composition.

The amount of the solvent in the resist composition is not particularly limited and is appropriately determined depending on the concentration which allows the composition to be applied to a substrate or the like and the thickness of the coating to be obtained. In general, the solvent is used so that the solid content concentration of the resist composition is within the range of preferably 0.5 to 20% by weight, more preferably 1 to 15% by weight.

II. Pattern Forming Method

The pattern forming method according to the present invention comprises the steps of:

(i) forming a resist film by applying the negative-working resist composition of the present invention onto a substrate and heating the same, and (ii) exposing the resist film to electron beam, EUV or X-ray, and heating and then developing the same.

According to the pattern forming method of the present invention, it is possible to form a high-resolution, well-shaped pattern at high sensitivity.

Hereinafter, each of the steps of the pattern forming method will be described.

(i) Step of Forming a Resist Film by Applying the Negative-Working Resist Composition of the Present Invention onto a Substrate and Heating the Same In this step, at first, the negative-working resist composition is applied onto a substrate.

The method for applying the composition is not particularly limited as long as it is a method by which the negative-working resist composition can be evenly applied to the surface of a substrate. Various methods are usable, such as a spraying method, a roll coating method and a spin-coating method.

Next, a post applied bake (PAB) is performed on the negative-working resist composition applied onto the substrate to remove the organic solvent (F), thereby forming a resist film.

The post-applied baking temperature is appropriately determined depending on the components of the composition, the used amount of each component, the type of the organic solvent (F), etc. In general, the temperature is 50 to 160° C., preferably 60 to 150° C. The post-applied baking time is normally 30 seconds to 15 minutes.

(ii) Step of Exposing the Resist Film to Electron Beam, EUV or X-Ray, and Heating and then Developing the Same In this step, at first, using an exposure device such as an electron beam lithography device or EUV exposure device, the resist film is exposed through a mask that has a predetermined pattern, or is selectively exposed by, for example, direct electron beam lithography using no mask.

The exposing source is not particularly limited. The exposure can be performed by means of ArF excimer laser, KrF excimer laser, $F_2$ excimer laser, extreme ultraviolet (EUV), electron beam, X-ray, etc.

After the exposure, a post exposure bake (PEB) is performed. Conditions for the PEB treatment are a temperature of 50 to 160° C. and a time of about 0.1 to 15 minutes.

Next, the substrate subjected to the PEB treatment is developed in an alkaline developer to remove unexposed portions.

As the method for development, there may be mentioned a puddle development method, a dipping method, a vibration dipping method, etc.

As the alkaline developer used for the negative-working resist composition of the present invention, for example, there may be mentioned aqueous solutions of alkalis including inorganic alkalis such as sodium hydroxide, potassium hydroxide, sodium carbonate, sodium silicate, sodium metasilicate and ammonia water; primary amines such as ethylamine and n-propylamine; secondary amines such as diethylamine and di-n-butylamine; tertiary amines such as triethylamine and methyldimethylamine; alcohol amines such as dimethylethanolamine and triethanolamine; quaternary ammonium salts such as tetramethylammonium hydroxide, tetraethylammonium hydroxide and choline; cyclic amines such as pyrrole and piperidine. Also, there may be used a mixture of any of the above aqueous solutions of alkalis with an appropriate amount of alcohol such as isopropyl alcohol or an appropriate amount of surfactant such as nonionic surfactant. Among these alkaline developers, quaternary ammonium salts are preferred, and aqueous solutions of tetramethylammonium hydroxide and choline are more preferred.

In the case of using a tetramethylammonium hydroxide (TMAH) aqueous solution as the alkaline developer, the concentration of the aqueous solution is preferably 0.1% to 5%, more preferably 0.5% to 3%, particularly preferably 1.19% to 2.38%. A tetramethylammonium hydroxide aqueous solution in a concentration of 2.38% is most easily available generally in semiconductor industry. If the concentration of the tetramethylammonium hydroxide aqueous solution is less than 0.1%, the developer may be neutralized by carbon dioxide in the air. As a result, the sensitivity of the composition may be varied, and it may become difficult to stably obtain a product.

After the development is completed, a rinse treatment is performed to rinse off the alkaline developer remaining on the substrate and the resist composition dissolved by the alkaline developer. The substrate is then dried to obtain a resist pattern.

The present invention is not limited by the above-mentioned embodiments. The above-mentioned embodiments are examples, and any that has the substantially same essential features as the technical ideas described in claims of the present invention and exerts the same effects and advantages is included in the technical scope of the present invention.

EXAMPLES

The present invention will be hereinafter explained by way of examples. The scope of the present invention is not restricted by these examples.

Example 1

In a nitrogen atmosphere, 3-methoxyphenol of 12.4 g (0.1 mol) was dissolved in ethanol of 200 mL in a 300 mL three-necked flask. While cooling the flask in an ice bath, benzaldehyde of 10.6 g (0.1 mol) was added thereto. Then, concentrated hydrochloric acid of 25 mL was slowly added thereto in a dropwise manner, and the mixture was reacted at 70° C. for 12 hours. After the reaction was completed, the thus-obtained reaction solution was poured into distilled water of 500 mL and filtered to collect the resulting precipitate (yellow solid). The precipitate was washed in distilled water until it was neutralized. The solid obtained by the filtration was refined by column chromatography with ethyl acetate as the developing solvent, thereby obtaining a light yellow compound 1 (CRA-01) of 13.8 g (16.3 mmol, yield 65%) shown in Table 1. The structure of the compound was identified by electrospray ionization mass spectrometry (ESI-MS) and from a $^1$H-NMR spectrum.

Examples 2 to 11

According to the production method of Example 1, Compound 2 (CRA-02) to Compound 11 (CRA-11) were synthesized using the materials shown in Tables 1 and 2. The used materials, the thus-obtained compounds and their yields are shown in Tables 1 and 2.

TABLE 1

| | Resorcinol derivative | Aldehyde derivative | Calix resorcinarene derivative | Yield (%) |
|---|---|---|---|---|
| CRA-01 | HO—C6H3—OCH3 | C6H5—CHO | [HO—C6H2(OCH3)—CH(C6H5)]4 | 65 |
| CRA-02 | HO—C6H3—OCH3 | 2,4-(CH3)2C6H3—CHO | [HO—C6H2(OCH3)—CH(2,4-(CH3)2C6H3)]4 | 47 |
| CRA-03 | HO—C6H3—OCH2CH3 | 4-CH3O—C6H4—CHO | [HO—C6H2(OCH2CH3)—CH(4-OCH3-C6H4)]4 | 59 |
| CRA-04 | HO—C6H3—OCH2CH3 | 4-CH3CH2O—C6H4—CHO | [HO—C6H2(OCH2CH3)—CH(4-OCH2CH3-C6H4)]4 | 70 |

TABLE 1-continued
| | Resorcinol derivative | Aldehyde derivative | Calix resorcinarene derivative | Yield (%) |
|---|---|---|---|---|
| CRA-05 | 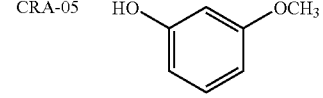 | 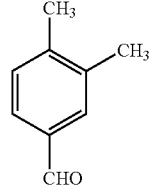 | 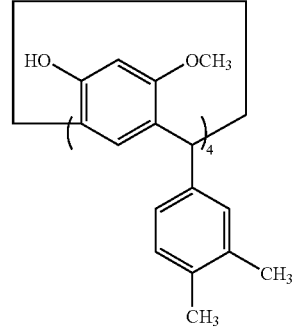 | 38 |
| CRA-06 | 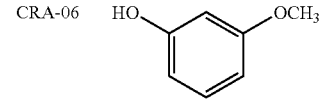 | 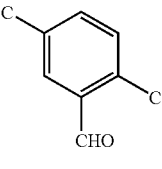 | 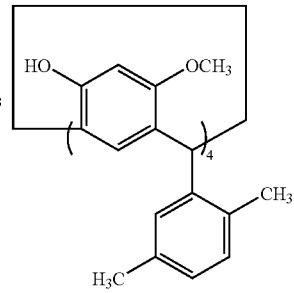 | 41 |
TABLE 2
| | Resorcinol derivative | Aldehyde derivative | Calix resorcinarene derivative | Yield (%) |
|---|---|---|---|---|
| CRA-07 | 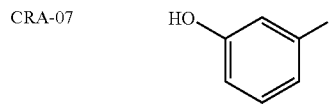 | 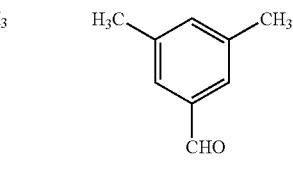 | 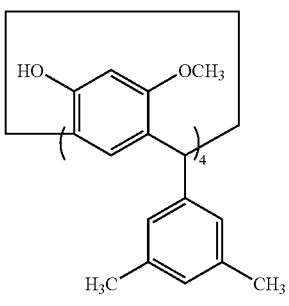 | 36 |
| CRA-08 | 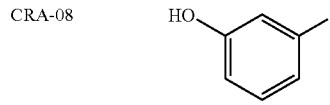 | 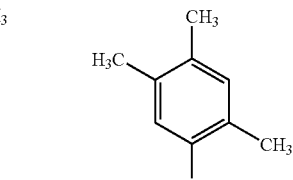 | 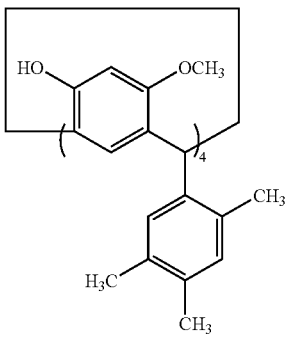 | 27 |

TABLE 2-continued

| | Resorcinol derivative | Aldehyde derivative | Calix resorcinarene derivative | Yield (%) |
|---|---|---|---|---|
| CRA-09 | 3-methoxyphenol (HO—C6H4—OCH3) | 4-(2-methyl-2-propyl)benzaldehyde | (calix resorcinarene from CRA-09 components, n=4) | 46 |
| CRA-10 | 3-ethoxyphenol (HO—C6H4—OCH2CH3) | 2,4-dimethylbenzaldehyde | (calix resorcinarene from CRA-10 components, n=4) | 38 |
| CRA-11 | 1,3-dipropoxybenzene | 4-hydroxybenzaldehyde | (calix resorcinarene from CRA-11 components, n=4) | 47 |

Comparative Example 1

C-methylcalix[4]resorcinarene (Compound 12) represented by the following chemical formula (13) was purchased from Sigma-Aldrich Corporation.

Chemical formula (13)

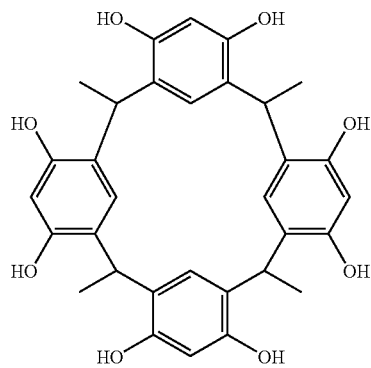

Comparative Example 2

According to the production method of Example 1, C-methylcalix[4]methylresorcinarene (Compound 13) represented by the following chemical formula (14) of 6.7 g (12.3 mmol, yield 49%) was obtained.

Chemical formula (14)

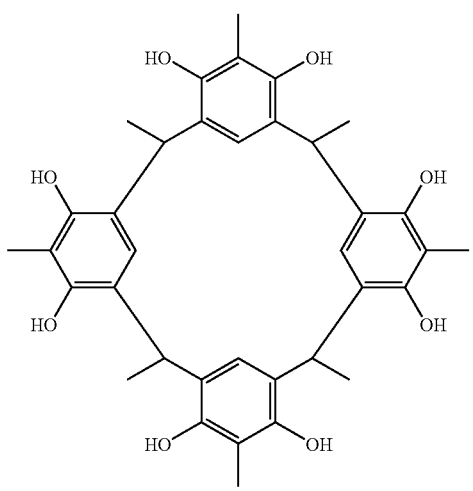

[Evaluation]
(1) Development Rate Measurement

The calix resorcinarene derivative (A) (CRA-01) obtained in Example 1 was dissolved in cyclopentanone by stirring so as to be 3% by weight with respect to cyclopentanone. The calix resorcinarene derivative (A)-containing solution thus obtained was applied evenly onto a 6-inch silicon wafer by means of a spinner, followed by a post-applied baking (PAB) treatment at 100° C. for 60 seconds, thereby forming a coating film having a thickness of 120 nm. By means of a resist development analyzer ("RDA-800" manufactured by Litho Tech Japan Corporation), the thus-obtained coating film was measured for the development rates in tetramethylammonium hydroxide (TMAH) aqueous solutions in the concentrations shown in Table 3. The development rates (nm/sec) of the calix resorcinarene derivative (A) (CRA-01) were each obtained by dividing coating film thickness (120 nm) by development time (sec).

In the same manner as above, the calix resorcinarene derivatives (A) (CRA-02 to CRA-11), Compound 12 and Compound 13 were measured for the development rates in TMAH aqueous solutions in the concentrations shown in Table 3. The results are shown in Table 3.

Example 12

The calix resorcinarene derivative (A) obtained in Example 1 of 100 parts by weight and, with respect to the total solid content thereof, triphenylsulfonium nonafluorobutanesulfonate of 10 parts by weight as the acid generator (B), 4,4'-methylenebis[2,6-bis(hydroxymethyl)]phenol of 20 parts by weight as the cross-linking agent (C) and tri-n-octylamine of 1 part by weight as the organic basic compound (E) were dissolved in cyclopentanone as the organic solvent (F), thereby obtaining a negative-working resist composition having a solid content concentration of 2.6 parts by weight.

Example 13

A negative-working resist composition was obtained in the same manner as in Example 12 except that the calix resorcinarene derivative (A) obtained in Example 2 was used.

Example 14

A negative-working resist composition was obtained in the same manner as in Example 13 except that triphenylsulfonium trifluoromethylsulfonate was used as the acid generator (B).

Example 15

A negative-working resist composition was obtained in the same manner as in Example 14 except that hexamethoxymethylmelamine was used as the cross-linking agent (C).

Example 16

A negative-working resist composition was obtained in the same manner as in Example 14 except that cyclohexanone was used as the organic solvent (F).

Example 17

A negative-working resist composition was obtained in the same manner as in Example 14 except that propylene glycol monomethyl ether acetate was used as the organic solvent (F).

Example 18

A negative-working resist composition was obtained in the same manner as in Example 14 except that propylene glycol monomethyl ether was used as the organic solvent (F).

Example 19

A negative-working resist composition was obtained in the same manner as in Example 12 except that the calix resorcinarene derivative (A) obtained in Example 3 was used.

Example 20

A negative-working resist composition was obtained in the same manner as in Example 12 except that the calix resorcinarene derivative (A) obtained in Example 4 was used.

Example 21

A negative-working resist composition was obtained in the same manner as in Example 12 except that the calix resorcinarene derivative (A) obtained in Example 5 was used.

Example 22

A negative-working resist composition was obtained in the same manner as in Example 12 except that the calix resorcinarene derivative (A) obtained in Example 6 was used.

Example 23

A negative-working resist composition was obtained in the same manner as in Example 12 except that the calix resorcinarene derivative (A) obtained in Example 7 was used.

Example 24

A negative-working resist composition was obtained in the same manner as in Example 12 except that the calix resorcinarene derivative (A) obtained in Example 8 was used.

Example 25

A negative-working resist composition was obtained in the same manner as in Example 12 except that the calix resorcinarene derivative (A) obtained in Example 9 was used.

Example 26

A negative-working resist composition was obtained in the same manner as in Example 12 except that the calix resorcinarene derivative (A) obtained in Example 10 was used.

Example 27

A negative-working resist composition was obtained in the same manner as in Example 14 except that poly(4-vinylphenol-co-methyl methacrylate) represented by the following chemical formula (15) (manufactured by Sigma-Aldrich Corporation, weight average molecular weight (Mw): within 10,000) of 3 parts by weight was used as the resin (D).

Chemical formula (15)

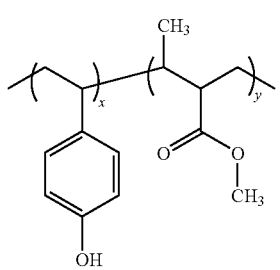

x:y = 1.8:1.0

Example 28

A negative-working resist composition was obtained in the same manner as in Example 14 except that 80 parts by weight of Compound 2 obtained in Example 2 and 20 parts by weight of Compound 11 obtained in Example 11 were used as the calix resorcinarene derivative (A).

Comparative Examples 3 and 4

In the same manner as in Example 12, negative-working resist compositions having a solid content concentration of 2.6 parts by weight were obtained by using the calix resorcinarene compounds (Compound 12 and Compound 13).

Table 4 shows the composition of each of the negative-working resist compositions obtained in Examples to 28 and Comparative examples 3 and 4. The abbreviations shown in Table 4 refer to the following:

(B)-1: Triphenylsulfonium nonafluorobutanesulfonate
(B)-2: Triphenylsulfonium trifluoromethylsulfonate
(C)-1: 4,4'-methylenebis[2,6-bis(hydroxymethyl)]phenol
(C)-2: Hexamethoxymethylmelamine
(D)-1: Poly(4-vinylphenol-co-methyl methacrylate)
(E)-1: Tri-n-octylamine
(F)-1: Cyclopentanone
(F)-2: Cyclohexanone
(F)-3: Propylene glycol monomethyl ether acetate
(F)-4: Propylene glycol monomethyl ether <Formation of Resist Pattern and Method for Evaluating the Same>

Resist patterns were formed by the following method using the resist compositions obtained in Examples 12 to 28 and Comparative examples 3 and 4, and then evaluated. The results are shown in Table 4.

(1) Application of the Resist

Each of the resist compositions was evenly applied onto a 6-inch silicon substrate by means of a spinner, followed by a post-applied baking (PAB) treatment at 100° C. for 60 seconds, thereby forming a resist film having a thickness of 80 nm.

(2) Formation of Resist Pattern

Lithography was performed on the resist films by means of an electron beam lithography device (accelerating voltage: 50 kV).

After the lithography was completed, a post exposure bake (PEB) treatment was performed thereon at 100° C. for 60 seconds. Then, each of the resist films was developed in a TMAH aqueous solution of 2.38% by mass (23° C.) for 30 seconds and rinsed in pure water for 60 seconds, thereby forming a line and space (L/S) pattern.

(3) Evaluation Method

[Sensitivity and Resolution]

The sensitivity of each resist film was measured in units of $\mu C/cm^2$. The sensitivity refers to the minimum irradiance at which a L/S pattern of 100 nm is formed at the ratio of 1:1. The resolution refers to the limiting resolution of the irradiance (the resolution where the line and space are separately resolved). The resolution was confirmed by means of a critical dimension-SEM manufactured by HOLON Co., Ltd.

TABLE 3

| | Compound | Development rate (nm/sec) in each concentration of TMAH aqueous solutions | | |
|---|---|---|---|---|
| | | Concentration 2.38% | Concentration 1.19% | Concentration 0.1% |
| Example 1 | 1 | 6,612.5 | 818.8 | <0.5 |
| Example 2 | 2 | 24.3 | 4.8 | <0.5 |
| Example 3 | 3 | 1,123.7 | 176.4 | <0.5 |
| Example 4 | 4 | 312.5 | 25.8 | <0.5 |
| Example 5 | 5 | 21.3 | 3.0 | <0.5 |
| Example 6 | 6 | 9.7 | 1.8 | <0.5 |
| Example 7 | 7 | 31.4 | 4.6 | <0.5 |
| Example 8 | 8 | 0.7 | <0.5 | <0.5 |
| Example 9 | 9 | 1.3 | <0.5 | <0.5 |
| Example 10 | 10 | 8.4 | <0.5 | <0.5 |
| Example 11 | 11 | 1.5 | <0.5 | <0.5 |
| Comparative example 1 | 12 | >10,000 | >10,000 | 128.8 |
| Comparative example 2 | 13 | >10,000 | >10,000 | 123.3 |

TABLE 4

| | Compound (100 parts by weight) | Acid generator (B) (10 parts by weight) | Cross-linking agent (C) (20 parts by weight) | Resin (D) (3 parts by weight) | Organic basic compound (E) (1 part by weight) | Organic solvent (F) (4,869 parts by weight) | Sensitivity ($\mu C/cm^2$) | Resolution (nm) |
|---|---|---|---|---|---|---|---|---|
| Example 12 | Compound 1 | (B)-1 | (C)-1 | — | (E)-1 | (F)-1 | 100 | 50 |
| Example 13 | Compound 2 | (B)-1 | (C)-1 | — | (E)-1 | (F)-1 | 20 | 30 |
| Example 14 | Compound 2 | (B)-2 | (C)-1 | — | (E)-1 | (F)-1 | 18 | 28 |
| Example 15 | Compound 2 | (B)-2 | (C)-2 | — | (E)-1 | (F)-1 | 85 | 30 |
| Example 16 | Compound 2 | (B)-2 | (C)-1 | — | (E)-1 | (F)-2 | 26 | 32 |
| Example 17 | Compound 2 | (B)-2 | (C)-1 | — | (E)-1 | (F)-3 | 29 | 30 |
| Example 18 | Compound 2 | (B)-2 | (C)-1 | — | (E)-1 | (F)-4 | 19 | 30 |
| Example 19 | Compound 3 | (B)-1 | (C)-1 | — | (E)-1 | (F)-1 | 100 | 50 |
| Example 20 | Compound 4 | (B)-1 | (C)-1 | — | (E)-1 | (F)-1 | 45 | 45 |
| Example 21 | Compound 5 | (B)-1 | (C)-1 | — | (E)-1 | (F)-1 | 23 | 30 |
| Example 22 | Compound 6 | (B)-1 | (C)-1 | — | (E)-1 | (F)-1 | 19 | 28 |
| Example 23 | Compound 7 | (B)-1 | (C)-1 | — | (E)-1 | (F)-1 | 25 | 28 |
| Example 24 | Compound 8 | (B)-1 | (C)-1 | — | (E)-1 | (F)-1 | 15 | 30 |
| Example 25 | Compound 9 | (B)-1 | (C)-1 | — | (E)-1 | (F)-1 | 16 | 35 |
| Example 26 | Compound 10 | (B)-1 | (C)-1 | — | (E)-1 | (F)-1 | 81 | 40 |
| Example 27 | Compound 2 | (B)-2 | (C)-1 | (D)-1 | (E)-1 | (F)-1 | 22 | 26 |
| Example 28 | Compound 2 (80 parts by weight) and Compound 11 (20 parts by weight) | (B)-2 | (C)-1 | — | (E)-1 | (F)-1 | 18 | 30 |
| Comparative example 3 | Compound 12 | (B)-1 | (C)-1 | — | (E)-1 | (F)-1 | — | — |
| Comparative example 4 | Compound 13 | (B)-1 | (C)-1 | — | (E)-1 | (F)-1 | — | — |

<Summary of the Results>

From the results shown in Table 3, it is clear that by using the compound of the present invention, the development rate in a TMAH aqueous solution in a concentration of 1.19% was optimized to 2,000 nm/sec or less. It is also clear that the compounds used in Comparative examples 1 and 2 (C-methylcalix[4]resorcinarene and C-methylcalix[4]methylresorcinarene) resulted in extremely higher development rates than the compounds of the present invention.

From the results shown in Tables 3 and 4, it is clear that the negative-working resist composition of the present invention was provided with high sensitivity and high resolution by optimizing the development rate of the same in a TMAH aqueous solution in a concentration of 1.19% so as to be 2,000 nm/sec or less. For example, in Example 2, the development rate in a TMAH aqueous solution in a concentration of 1.19% was extremely decreased to as low as 4.8 nm/sec; therefore, in Example 13 using the compound of Example 2, the sensitivity was as high as 20 $\mu C/cm^2$, and the resolution was as high as 30 nm, both of which are higher than ever before.

In Comparative examples 3 and 4, because the development rates were very fast, no L/S pattern shape was formed at 100 nm, thereby failing to measure the sensitivity and resolution.

In Examples 21 to 23 which used Compounds 5 to 7, respectively, which are different from Compound 2 in the substitution site of the methyl group that the benzene ring at $R^1$ has, high sensitivity and high resolution were obtained, and this result is similar to Example 13 using Compound 2 In Examples 8 and 24 each of which used Compound 8 in which the benzene ring at $R^1$ had three methyl groups, the development rates in the TMAH aqueous solutions were lower than Examples 2 and 13 each of which used Compound 2 in which the benzene ring at $R^1$ had two methyl groups, and high sensitivity was obtained. In Examples 9 and 25 each of which used Compound 9 in which the benzene ring at $R^1$ had a t-butyl group as substituent, the development rates in the TMAH aqueous solutions were lower than Examples 2 and 13 each of which used Compound 2 in which the benzene ring at $R^1$ had a methyl group as substituent, and high sensitivity was obtained.

In Examples 10 and 26 each of which used Compound 10 in which $OR^2$ is an ethoxy group, the development rates in the TMAH aqueous solutions were lower than Examples 2 and 13 each of which used Compound 2 in which $OR^2$ is a methoxy group, and low sensitivity was obtained. The reason is thought to be that because $OR^2$ was changed from a methoxy group to an ethoxy group, reaction was inhibited by steric hindrance. As a result, it was found that preferred as $OR^2$ is a methoxy group.

In Example 27 which used the resin (D), pattern collapse was inhibited, and an improvement of the resolution was confirmed.

In Example 28 which used, as the calix resorcinarene derivative (A), the mixture of Compound 2 and Compound 11 in which $R^2$s were all non-acid-decomposable groups and the benzene ring at $R^1$ had a hydroxyl group as substituent, the pattern was not deteriorated, and high sensitivity and high resolution were obtained.

The invention claimed is:

1. A negative-working resist composition comprising a calix resorcinarene derivative (A) represented by the following chemical formula (1), an acid generator (B) which directly or indirectly generates an acid when exposed to an active energy ray having a wavelength of 248 nm or less, and a cross-linking agent (C):

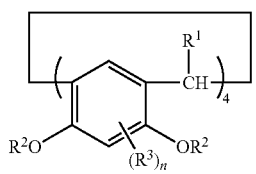

Chemical formula (1)

wherein $R^1$ is an aryl group, an aryl group having a substituent, a cycloalkyl group, a cycloalkyl group having a substituent, or a group represented by the following chemical formula (2):

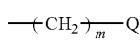

Chemical formula (2)

wherein Q is an aryl group, an aryl group having a substituent, a cycloalkyl group or a cycloalkyl group having a substituent; and m is an integer of 1 or 2;
wherein each $R^2$ is independently an alkyl group having 1 to 5 carbon atoms, a non-acid-decomposable group which is not decomposed by the action of acid and comprises an alkyl group having 1 to 5 carbon atoms and a substituent selected from the group consisting of a hydroxyl group, a halogen atom and a monovalent group represented by —$OR^a$, or a hydrogen atom; the monovalent group represented by —$OR^a$ is bound to a carbon atom other than the first carbon atom of the alkyl group having 1 to 5 carbon atoms, $R^a$ is an alkyl group having 1 to 5 carbon atoms; four to eight of $R^2$s contained in one molecule are non-acid-decomposable groups, and in the case where all $R^2$s are non-acid-decomposable groups, $R^1$ is a group having a hydroxyl group; $R^3$ is an alkyl group having 1 to 5 carbon atoms, an alkyl group having 1 to 5 carbon atoms and a substituent, or a halogen atom; n is an integer of 0 to 2; and groups represented by the same symbol in the formula (1) may be the same or different.

2. The negative-working resist composition according to claim 1, further comprising a resin (D) which has a repeating unit represented by the following chemical formula (3) and is soluble in alkali developer:

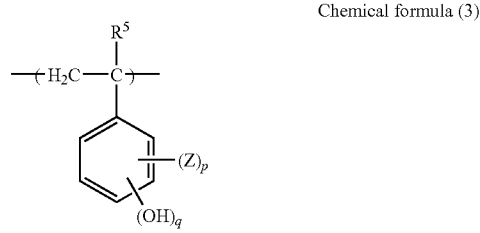

Chemical formula (3)

wherein Z is a halogen atom, a cyano group, a nitro group, an alkyl group, an acyl group, an acyloxy group, an alkylsulfonyl group or an alkoxy group; in the case where plurality of Zs are present, they may be the same or different; $R^5$ is a hydrogen atom, a methyl group, a halogen atom, a cyano group or a trifluoro group; p is an integer of 2 to 4; q is an integer of 1 to 3; and p+q≦5.

3. The negative-working resist composition according to claim 1, further comprising an organic basic compound (E).

4. The negative-working resist composition according to claim 1, wherein the calix resorcinarene derivative (A) has a development rate of 10 nm/sec or less in a tetramethylammonium hydroxide (TMAH) solution in a concentration of 0.1% by mass.

5. The negative-working resist composition according to claim 1, wherein the calix resorcinarene derivative (A) has a development rate of 2,000 nm/sec or less in a tetramethylammonium hydroxide (TMAH) solution in a concentration of 1.19% by mass.

6. A pattern forming method comprising the steps of:
(i) forming a resist film by applying the negative-working resist composition according to any of claims 1 to 5 onto a substrate and heating the same, and
(ii) exposing the resist film to electron beam, EUV or X-ray, and heating and then developing the same.

* * * * *